US009653144B1

(12) United States Patent
Man et al.

(10) Patent No.: US 9,653,144 B1
(45) Date of Patent: May 16, 2017

(54) APPARATUSES, METHODS, AND SYSTEMS FOR PACKAGE ON PACKAGE MEMORY REFRESH AND SELF-REFRESH RATE MANAGEMENT

(71) Applicants: Xiuting C. Man, Beaverton, OR (US); Stanley S. Kulick, Portland, OR (US)

(72) Inventors: Xiuting C. Man, Beaverton, OR (US); Stanley S. Kulick, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/195,982

(22) Filed: Jun. 28, 2016

(51) Int. Cl.
G11C 7/04 (2006.01)
G11C 11/406 (2006.01)

(52) U.S. Cl.
CPC .. G11C 11/40626 (2013.01); G11C 11/40615 (2013.01)

(58) Field of Classification Search
CPC ........ G11C 7/04; G11C 11/40626; H03K 5/00
USPC .............................. 365/211, 210.2, 222, 174
See application file for complete search history.

(56) References Cited

U.S. PATENT DOCUMENTS

2016/0148905 A1* 5/2016 Yu ........................ H01L 25/0657
257/48
2016/0284386 A1* 9/2016 McCall ................ G11C 7/1057

\* cited by examiner

Primary Examiner — Han Yang
(74) Attorney, Agent, or Firm — Nicholson De Vos Webster & Elliott, LLP

(57) ABSTRACT

Methods, systems, and apparatuses relating to package on package memory refresh and self-refresh rate management are described. In one embodiment, an apparatus includes a processor die, a dynamic memory die mounted to and overlapping the processor die, a first thermal sensor of the processor die disposed adjacent to a first hot spot from a first type of workload and a second thermal sensor of the processor die disposed adjacent to a second hot spot from a second type of workload, and a hardware control circuit of the processor die to cause a refresh of a capacitor of the dynamic memory die when either of an output of the first thermal sensor exceeds a first threshold value and an output of the second thermal sensor exceeds a second threshold value.

24 Claims, 13 Drawing Sheets

1100

PROVIDING A PROCESSOR DIE AND A DYNAMIC MEMORY DIE MOUNTED TO AND OVERLAPPING THE PROCESSOR DIE, WHEREIN A FIRST THERMAL SENSOR OF THE PROCESSOR DIE IS DISPOSED ADJACENT TO A FIRST HOT SPOT FROM A FIRST TYPE OF WORKLOAD AND A SECOND THERMAL SENSOR OF THE PROCESSOR DIE IS DISPOSED ADJACENT TO A SECOND HOT SPOT FROM A SECOND TYPE OF WORKLOAD 1102

↓

CAUSING, WITH A HARDWARE CONTROL CIRCUIT OF THE PROCESSOR DIE, A REFRESH OF A CAPACITOR OF THE DYNAMIC MEMORY DIE WHEN EITHER OF AN OUTPUT OF THE FIRST THERMAL SENSOR EXCEEDS A FIRST THRESHOLD VALUE AND AN OUTPUT OF THE SECOND THERMAL SENSOR EXCEEDS A SECOND THRESHOLD VALUE 1104

1100 

PROVIDING A PROCESSOR DIE AND A DYNAMIC MEMORY DIE MOUNTED TO AND OVERLAPPING THE PROCESSOR DIE, WHEREIN A FIRST THERMAL SENSOR OF THE PROCESSOR DIE IS DISPOSED ADJACENT TO A FIRST HOT SPOT FROM A FIRST TYPE OF WORKLOAD AND A SECOND THERMAL SENSOR OF THE PROCESSOR DIE IS DISPOSED ADJACENT TO A SECOND HOT SPOT FROM A SECOND TYPE OF WORKLOAD 1102

CAUSING, WITH A HARDWARE CONTROL CIRCUIT OF THE PROCESSOR DIE, A REFRESH OF A CAPACITOR OF THE DYNAMIC MEMORY DIE WHEN EITHER OF AN OUTPUT OF THE FIRST THERMAL SENSOR EXCEEDS A FIRST THRESHOLD VALUE AND AN OUTPUT OF THE SECOND THERMAL SENSOR EXCEEDS A SECOND THRESHOLD VALUE 1104

FIG. 11

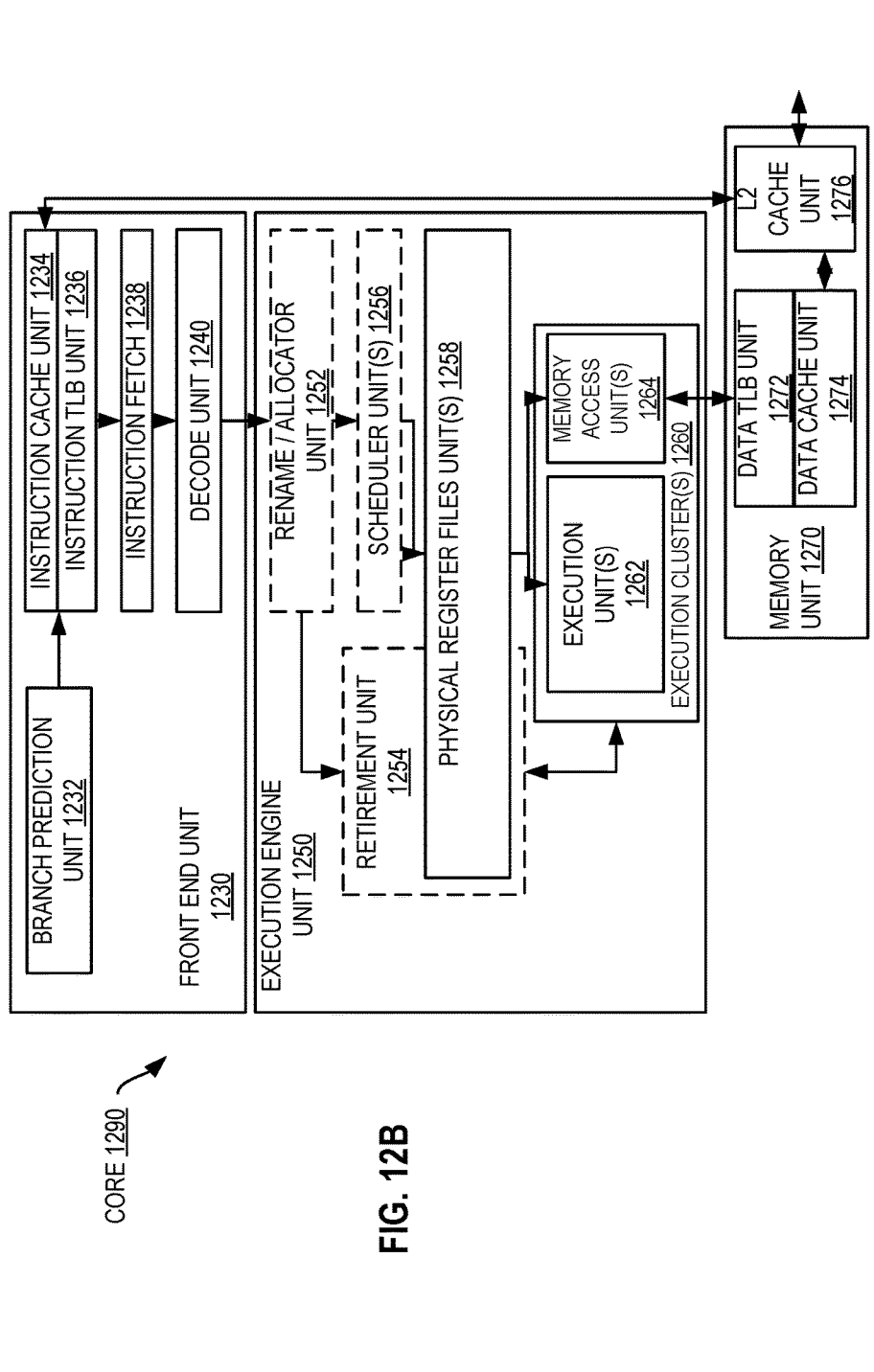
FIG. 12A
FIG. 12B

APPARATUSES, METHODS, AND SYSTEMS FOR PACKAGE ON PACKAGE MEMORY REFRESH AND SELF-REFRESH RATE MANAGEMENT

TECHNICAL FIELD

The disclosure relates generally to electronics, and, more specifically, an embodiment of the disclosure relates to a hardware control circuit to control a package on package memory refresh and/or self-refresh rate.

BACKGROUND

A processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). It should be noted that the term instruction herein may refer to a macro-instruction, e.g., an instruction that is provided to the processor for execution, or to a micro-instruction, e.g., an instruction that results from a processor's decoder decoding macro-instructions.

BRIEF DESCRIPTION OF THE DRAWINGS

The present disclosure is illustrated by way of example and not limitation in the figures of the accompanying drawings, in which like references indicate similar elements and in which:

FIG. 11 illustrates a flow diagram according to embodiments of the disclosure.

FIG. 12A is a block diagram illustrating both an exemplary in-order pipeline and an exemplary register renaming, out-of-order issue/execution pipeline according to embodiments of the disclosure.

FIG. 12B is a block diagram illustrating both an exemplary embodiment of an in-order architecture core and an exemplary register renaming, out-of-order issue/execution architecture core to be included in a processor according to embodiments of the disclosure.

DETAILED DESCRIPTION

In the following description, numerous specific details are set forth. However, it is understood that embodiments of the disclosure may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A (e.g., hardware) processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). It should be noted that the term instruction herein may refer to a macro-instruction, e.g., an instruction that is provided to the processor for execution, or to a micro-instruction, e.g., an instruction that results from a processor's decode unit (decoder) decoding macro-instructions. A processor (e.g., having one or more cores to decode and/or execute instructions) may operate on data, for example, in performing arithmetic, logic, or other functions. A processor (e.g., having one or more cores) may be formed on a single die. A die may generally refer to a (e.g., single) piece of semiconductor (e.g., silicon) material with one or more integrated circuits formed therein. A system on a chip (SoC) may generally refer to a single integrated circuit die with a plurality of electronic components included therein, e.g., on-die (e.g., cache) memory, processor(s), graphics processor(s), peripheral interfaces, I/O control, etc.

Figure 1:
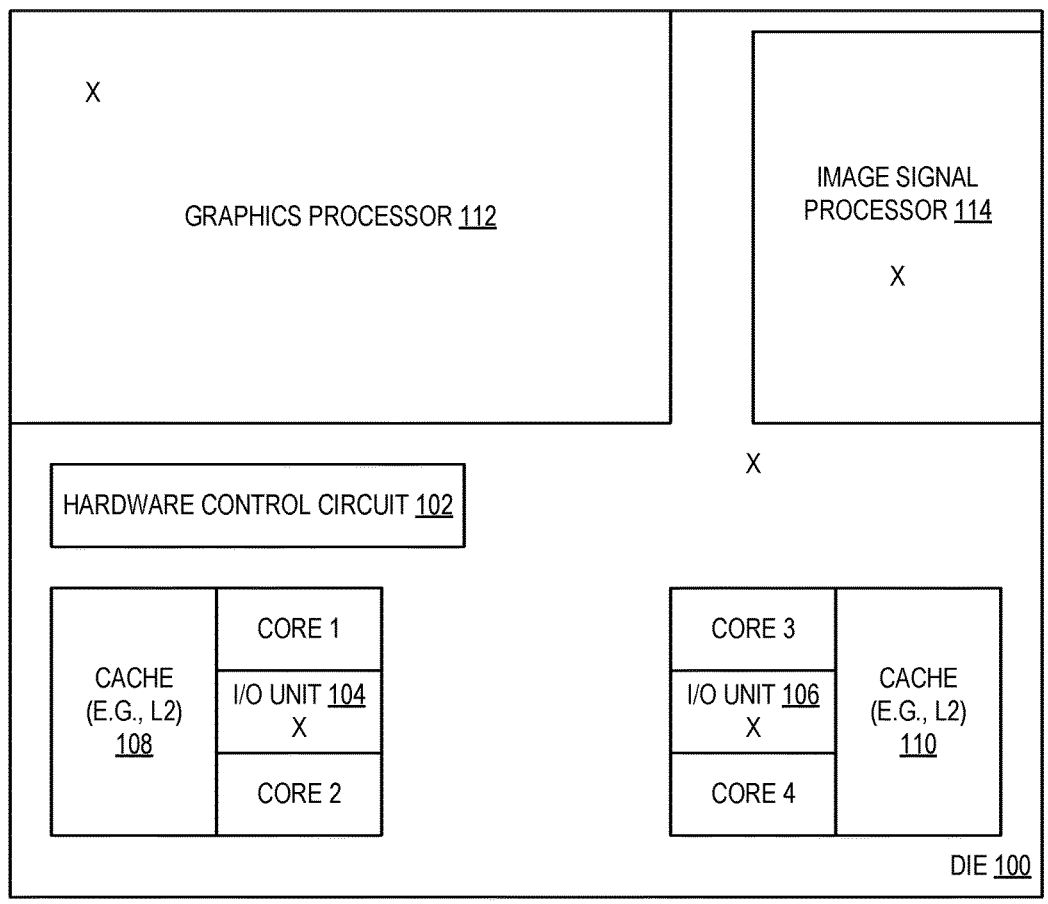
FIG. 1 illustrates a die according to embodiments of the disclosure.

FIG. 1 illustrates a die 100 according to embodiments of the disclosure. Die 100 may be a processor die (e.g., a central processing unit (CPU) die). In certain embodiments, die 100 may include any of the components discussed below, e.g., processor components. Die 100 may be a system on a chip (SoC) die. In certain embodiments, die 100 may include any of the components discussed below, e.g., SoC components. Depicted die 100 includes certain components, but in other embodiments, one or any combination of components may be utilized.

Depicted die 100 includes multiple cores 1-4 (e.g., each with its own decoder and execution unit). A core may include a (e.g., L1) cache (not depicted). A cluster of cores may include an I/O unit, e.g., I/O unit 104 for cores 1-2 and I/O unit 106 for cores 3-4. A cluster of cores may include a (e.g., L2) cache, e.g., cache 108 shared by cores 1-2 and cache 110 shared by cores 3-4. Depicted die 100 includes graphics processor 112 (e.g., to create images and/or frames to display) and image signal processor 114 (for example, to determine colors, etc. for an input image, e.g., from a camera).

The X symbols in FIG. 1 are thermal sensors, e.g., outputting a value to indicate a temperature. Although multiple thermal sensors are depicted, certain embodiments herein may include a single thermal sensor or any plurality of thermal sensors (for example, one in each component of a processor or SoC). Die 100 also includes a hardware control circuit 102, which is discussed further below. A thermal sensor may be a bandgap temperature sensor.

Note that the figures herein may not depict all data communication connections. One of ordinary skill in the art will appreciate that this is to not obscure certain details in the figures. Any or all combinations of communications paths may be utilized in certain embodiments herein (e.g., even if not depicted in the figures). Note that a double headed arrow in the figures may not require two-way communication, for example, it may indicate one-way communication (e.g., to or from that component or device).

Figure 2:
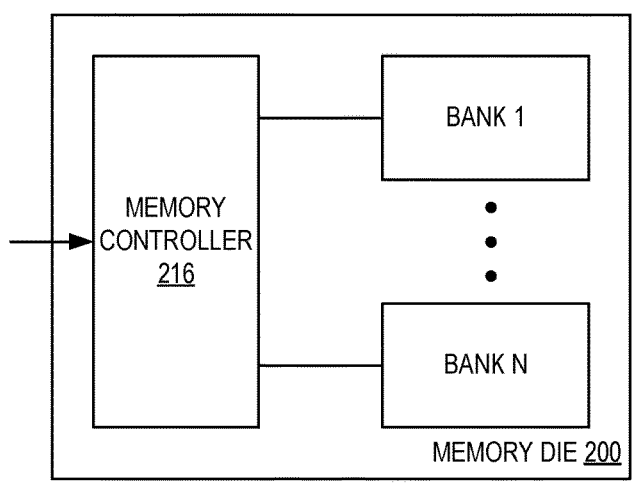
FIG. 2 illustrates a memory die according to embodiments of the disclosure.

FIG. 2 illustrates a memory die 200 according to embodiments of the disclosure. Memory die may include one or more banks (e.g., bank 1 . . . bank N) of memory devices (e.g., cells). Memory may be dynamic memory, e.g., dynamic random-access memory (DRAM). Depicted memory die 200 includes a memory controller 216. Memory controller 216 may receive a request to access (e.g., load or store) data, for example, from a component of a processor or a SoC. In one embodiment, a component(s) of processor die 100 requests access (e.g., to load or store data) to memory die 200. In one embodiment, one or more of a core (e.g., cores 1-4), a cache (e.g., caches 108 and 110), an I/O unit (e.g., I/O units 104 and 106), graphics processor (e.g., graphics processor 112), and image signal processor (e.g., image signal processor 114) access a memory (e.g., a memory die or dies), for example memory die 200.

Dynamic memory (e.g., DRAM) generally refers to memory that stores (e.g., each bit of) data in a separate capacitor within an integrated circuit. The capacitor may be either charged or discharged (e.g., as caused by the memory controller 216). The charged (e.g., above a threshold voltage) and uncharged (e.g., below a threshold voltage) states may be taken to represent the two values of a bit, e.g., a binary 0 and 1. As capacitors in this embodiment of dynamic memory are leaking charge (e.g., voltage), the stored information is not retained unless the capacitor charge is refreshed, e.g., periodically. In one embodiment, memory controller 216 is to refresh the capacitor charge with its current value according to a self-refresh (SR) rate, e.g., without receiving a command from a component external to the memory die 200.

Figure 3:
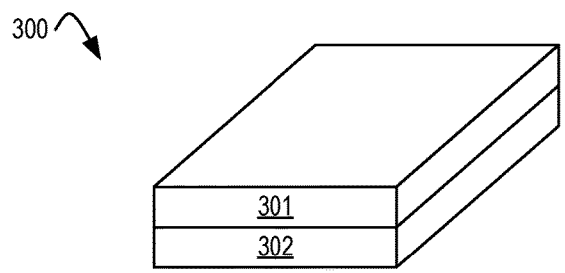
FIG. 3 illustrates a two die package on package according to embodiments of the disclosure.
Figure 4:
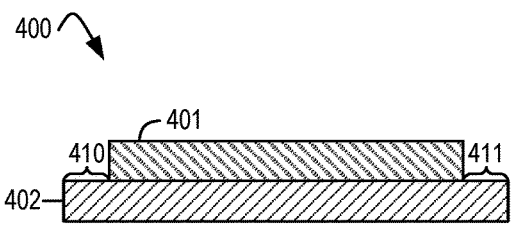
FIG. 4 illustrates a cross-sectional view of a two die package on package according to embodiments of the disclosure.
Figure 5:
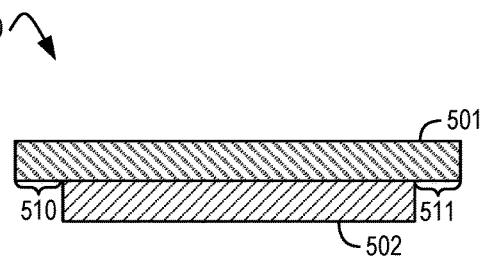
FIG. 5 illustrates a cross-sectional view of a two die package on package according to embodiments of the disclosure.

FIG. 3 illustrates a two die package on package 300 according to embodiments of the disclosure. FIGS. 4-5 illustrate examples of perspective cross-sectional view (e.g., as viewed from a side) of a two die POP. First die 301 may be mounted to second die 302, for example, with a mechanical attachment and an electrical coupling (e.g., connection). Die 301 may be a memory (e.g., DRAM) die and die 302 may be a SoC (e.g., processor) die. In one embodiment, die 301 is a lower power double data rate (DDR) memory.

FIG. 4 illustrates a cross-sectional view of a two die package on package 400 according to embodiments of the disclosure. Second die 402 may extend (e.g., laterally) beyond first die 401 along one or more of a first side 410 and a second side 411. Die 401 may be a memory (e.g., DRAM) die and die 402 may be a SoC (e.g., processor) die.

FIG. 5 illustrates a cross-sectional view of a two die package 500 on a package according to embodiments of the disclosure. Die 501 may be a memory (e.g., DRAM) die and die 502 may be a SoC (e.g., processor) die. First die 501 may extend (e.g., laterally) beyond second die 502 along one or more of a first side 510 and a second side 511. Die 501 may be a memory (e.g., DRAM) die and die 502 may be a SoC (e.g., processor) die.

These views may be of an X axis (e.g., length) or a Y axis (e.g., width), with the dies stacked along the Z axis (e.g., height). Note that the dimensions may not be to scale in certain embodiments.

Figure 6:
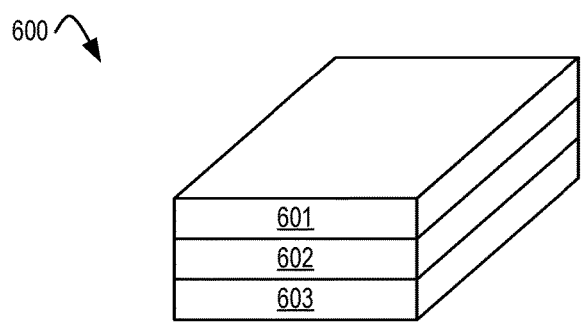
FIG. 6 illustrates a three die package on package according to embodiments of the disclosure.
Figure 7:
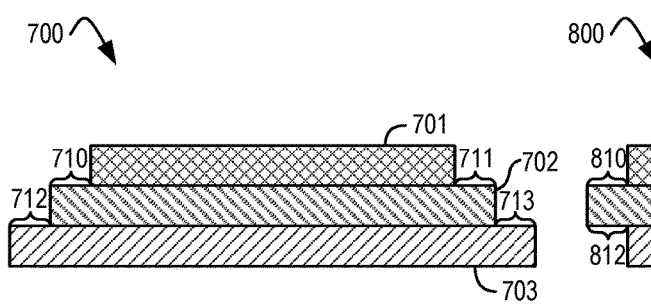
FIG. 7 illustrates a cross-sectional view of a three die package on package according to embodiments of the disclosure.
Figure 8:
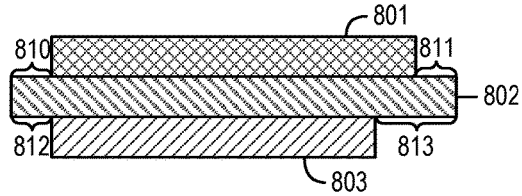
FIG. 8 illustrates a cross-sectional view of a three die package on package according to embodiments of the disclosure.

FIG. 6 illustrates a three die package on package 600 according to embodiments of the disclosure. FIGS. 7-8 illustrate examples of perspective cross-sectional view (e.g., as viewed from a side) of a three die POP. First die 601 may be mounted to second die 602 which may be mounted to a third die 603, for example, with a mechanical attachment and an electrical coupling (e.g., connection). Die 601 may be a memory (e.g., DRAM) die, die 602 may be a memory (e.g., wide I/O memory) die, and die 603 may be a SoC (e.g., processor) die. In one embodiment, die 602 is a lower power double data rate (DDR) memory die. In one embodiment, the bandwidth per die for a memory die 603 is higher than that for a memory die 602. Die 601 may be a memory (e.g., DRAM) die, die 603 may be a memory (e.g., wide I/O memory) die, and die 602 therebetween may be a SoC (e.g., processor) die.

FIG. 7 illustrates a cross-sectional view of a three die package on package 700 according to embodiments of the disclosure. Third die 703 may extend (e.g., laterally) beyond second die 702 along one or more of a first side 712 and a second side 713. Second die 702 may extend (e.g., laterally) beyond first die 701 along one or more of a first side 710 and a second side 711.

FIG. 8 illustrates a cross-sectional view of a three die package on package 800 according to embodiments of the disclosure. Second die 802 may extend (e.g., laterally) beyond first die 801 along one or more of a first side 810 and a second side 811. Second die 802 may extend (e.g., laterally) beyond third die 803 along one or more of a first side 812 and a second side 813. First die 801 may extend (e.g., laterally) beyond third die 803 along one or more of a first side (not depicted) and a second side (depicted).

These views may be of an X axis (e.g., length) or a Y axis (e.g., width), with the dies stacked along the Z axis (e.g., height). Note that the dimensions may not be to scale in certain embodiments.

In one embodiment, the electrical connection is one or more wires. In one embodiment, the dies are attached together with a polymer, thermal grease, and/or insulation. In one embodiment, a first die is from a first manufacturer and a second die is from a second, different manufacturer. In one embodiment, the dies are (e.g., perpendicular to their adjacent planar surfaces) spaced about 20 microns (μm) (micrometers) apart. Although not depicted, memory die may include one or more thermal sensors in certain embodiments. In certain embodiments, the thermal sensor(s) in the memory die may be less accurate (e.g., not provide the temperature but a thermal status), e.g., as compared to a thermal sensor that provides the temperature (e.g., in the processor or SoC die). In certain embodiments, a first type of thermal sensor may output a value with more precision (e.g., about 8 bits for each output value) than a second type of thermal sensor (e.g., outputting about 3 bits for each output value), for example, there is not a linear relationship between the output of the second type of thermal sensor and the detected temperature. In one embodiment, the first type of thermal sensor outputs a different value for at least each one degree change (e.g., in Celsius or Fahrenheit) in detected temperature. In one embodiment, a first die of a package on package (POP) includes a plurality of thermal sensors (e.g., of the first type) and a second die of the package on the package includes only a single thermal sensor (e.g., of the second type). In one embodiment, a package is mounted on top of another package, for example, a customer owned package on package (COPOP).

In certain embodiments, a package on package, e.g., a die on a die, the heat generated by use of one die transfers to an adjacent die or dies, e.g., with very little loss. In one embodiment, a memory (e.g., DRAM) die(s) and a processor die or system on a chip (SoC) die are put together in a package on package (POP) and the heat transfer therebetween may cause a loss of memory (e.g., DRAM) data. For example, the maximum temperature in the memory die may be impacted by its own power consumption and heat, but also by the processor or SoC power consumption and heat, e.g., dissipation. Embodiments of this disclosure describe a solution to control memory (e.g., DRAM) refresh rate to meet data retention requirements in multiple die POP configurations. Embodiments of this disclosure provide for a processor or SoC embedded circuit to control the memory refresh to address the problem described above. Certain embodiments herein do not involve processor die or SoC die external software and/or control that applies either bandwidth limiting or additional thermal/cooling solution to mitigate memory thermal problems, e.g., to stay within memory (e.g., DRAM) thermal requirements for data retention. Certain embodiments herein provide an embedded solution within a SoC (e.g., processor) and memory package on package (POP) to control (e.g., manage) thermal data retention risks without POP-external dependency. In one embodiment, the embedded hardware SoC (e.g., processor) control circuit runs at a (e.g., million second) time scale that enables POP power and performance optimization that is not achieved by external control logic. Certain embodiments herein provide a hardware control circuit for two die POP or three die POP, and may be scaled to work for a greater than three die POP. Certain embodiments herein provide a hardware control circuit to cause a memory to retain its data regardless of the relative size of a SoC or processor (e.g., CPU) die versus a memory (e.g., DRAM) die.

Certain embodiments herein provide a hardware control circuit to ensure a sufficient refresh or self-refresh of memory (e.g., DRAM) to avoid data retention loss, for example, with no or limited memory (e.g., DRAM) die and/or POP thermal information. Certain embodiments herein provide a hardware control circuit that takes one, a plurality, or all of the following (e.g., monitored) control inputs: memory (e.g., DRAM) die thermal status of limited thermal sensor(s) (e.g., of the second type) embedded in memory (e.g., DRAM) die, temperature distribution and estimated thermal gradient of SoC (e.g., processor) die (e.g., with a thermal sensor(s) of the first type), estimated memory (e.g., DRAM) die thermal gradients based on the adjacent SoC (e.g., processor) die thermal gradient, memory (e.g., DRAM) die power consumption, and SoC (e.g., processor) die power consumption.

Figure 9:
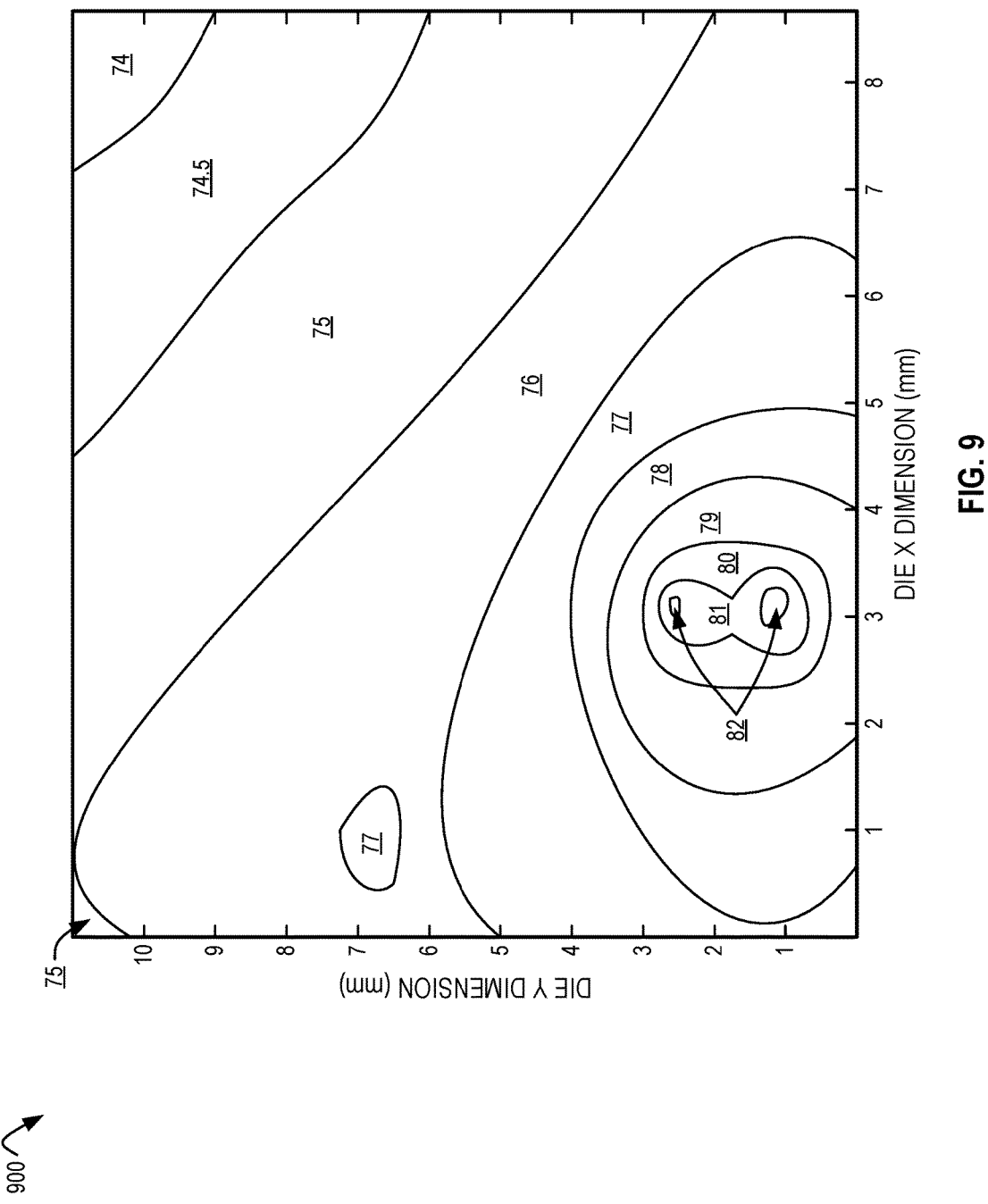
FIG. 9 illustrates a thermal map of a die in use according to embodiments of the disclosure.

Certain embodiments herein provide a hardware control circuit that uses one or more control logic inputs described above to manage memory (e.g., DRAM) self-refresh rate, for example, based on one or more of the algorithms discussed herein. Certain embodiments herein provide a hardware control circuit to estimate a thermal gradient of the SoC (e.g., processor), memory die, and/or POP. Certain embodiments herein provide a hardware control circuit that pre-emptively sets a sufficient self-refresh rate at entry of low(er) power states. Certain embodiments herein provide a hardware control circuit that delays or holds-off entry of self-refresh and/or low(er) power state, e.g., when the thermal gradient is too high to allow such an entry. Certain embodiments herein provide a hardware control circuit that outputs a refresh signal and/or a self-refresh signal (e.g., new value) or one or multiple memory (e.g., DRAM) dies. In one embodiment, a hardware control circuit is formed in a SoC (e.g., processor) die. Certain embodiments herein provide a hardware control circuit that supports monitoring of all inputs, processes the inputs and renders the decision(s) to control (e.g., change or keep) refresh rate, to control, keep, and/or delay self-refresh rate or a self-refresh entry point. Certain embodiments herein include detecting one or more of the hottest regions (e.g., hot spots) in a (e.g., SoC or processor) die and locating a thermal sensor (e.g., formed in the integrated circuit of the die) adjacent to the hot spot(s). A first sensor may be located adjacent to a hot (e.g., the hottest) spot for a first type of workload (e.g., a processor intensive operation) and a second sensor may be located adjacent to a hot (e.g., the hottest) spot for a second, different type of workload (e.g., a graphics intensive operation). FIG. 9 illustrates a thermal map 900 of a (e.g., SoC or processor) die in use according to embodiments of the disclosure. Map 900 illustrates two hotspots (e.g., 82° C.), for example, to locate one or more thermal sensors adjacent thereto in a die. In certain embodiments when one die extends beyond another die of a POP, a thermal sensor may be disposed in an area where the dies overlap.

Certain embodiments herein utilize one or more thermal gradient scaling factors to scale a SoC (e.g., or processor) die thermal gradient into an estimated memory die thermal gradient. In one embodiment of a two die POP, the SoC (e.g., or processor) die thermal gradient is used to estimate the memory die thermal gradient. In one embodiment of a three die POP having a SoC (e.g., or processor) die on an end, the SoC die thermal gradient is used to first estimate the thermal gradient of the middle die, and then another scaling factor is used to estimate the thermal gradient for the memory die on the opposing end. For example, in certain embodiments herein, a hotter spot of a die will impact how hot the adjacent die gets, and the dynamic memory refresh rate is to account for variations of hot (e.g., and cold spots) caused by the SoC die. In one embodiment, the SoC die creates more heat (e.g., hot spots) than a memory die. In certain embodiments, a hotspot(s) moves around depending the workload, for example, which element(s) are utilized (e.g., core, graphics processor, or image signal processor). In some workloads, cores may run very high performance while graphics processor or image signal processor may be idle or near idle. In certain cases, a SoC die hotspot(s) will cause a hotspot in memory (e.g., DRAM) and a control circuit is to utilize a higher (e.g., as compared to when the hotspot(s) are not as hot) refresh rate to ensure the memory content is maintained. In one embodiment, the hardware control circuit estimates (e.g., according to an algorithm) the SoC die thermal gradient and its impact to memory die(s) and uses the information to adjust the memory refresh rate as needed to retain the data, etc.

Figure 10:
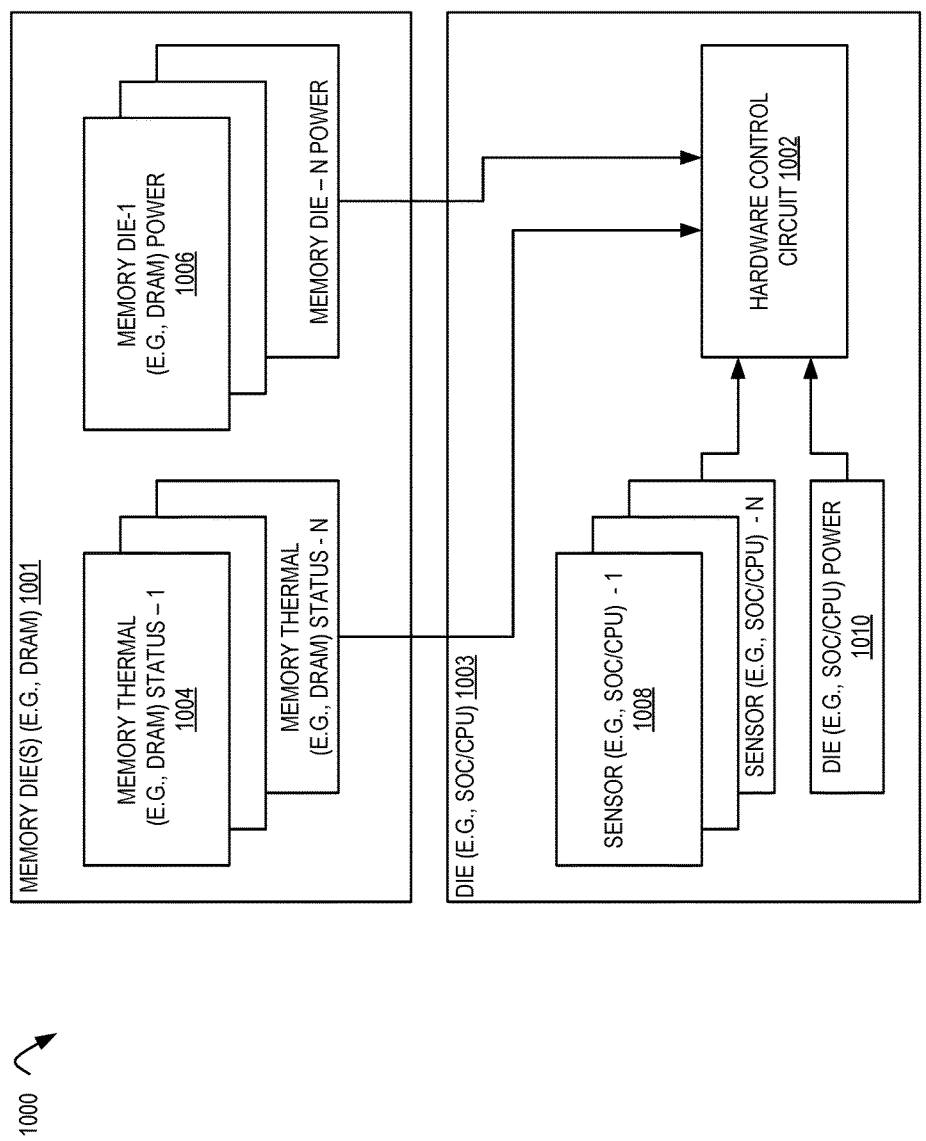
FIG. 10 illustrates a multiple die package on package according to embodiments of the disclosure.

FIG. 10 illustrates a multiple die package on package 1000 according to embodiments of the disclosure. Note that FIG. 10 is an exploded view in the sense that die 1001 is to be disposed on top of die 1003, e.g., as in any of FIGS. 3-5. Multiple die package on package 1000 includes a memory die 1001 and second die 1003 (e.g., SoC or processor). Depicted memory die 1001 includes a thermal status value (for example, from thermal sensor 1004, e.g., of the second type). In one embodiment, a thermal status value is provided for each memory bank (e.g., cells). In one embodiment, a power consumption value (e.g., from sensor 1006) is provided for each memory bank (e.g., cells), e.g., for each respective thermal status value.

Depicted (e.g., SoC or processor) die 1003 includes multiple thermal sensors (e.g., of the first type), e.g., outputting a temperature value. For example, thermal sensor-1 1008 to sensor-N may be distributed around die 1003 and not stacked as schematically depicted. Depicted die 1003 includes a (e.g., single) power consumption value of the die 1003, e.g., from sensor 1010. Depicted die 1003 includes a hardware control circuit 1002. Hardware control circuit 1002 may receive as input values one or more of the above values.

In certain embodiments, hardware control circuit 1002 may take as input one, a plurality, or all of the following: die 1003 (e.g., SoC) thermal sensor readings, memory die 1001 thermal status, SoC power consumption, and memory power consumption. Die 1003 may include one or more of the following components to obtain (e.g., read and/or monitor) the input(s): power management unit (Punit), data unit (Dunit), digital thermometer sensor (DTS), etc.

Hardware control circuit 1002 may include circuitry to apply a control algorithm to the input(s) and estimate thermal gradients, for example, to use to control a refresh rate (e.g., a self-refresh rate) provided to the memory die 1001. In one embodiment, hardware control circuit 1002 disables entry of the memory die 1001 into a self-refresh mode, e.g., when a thermal gradient exceeds a threshold value.

In certain embodiments, a hardware control unit implements the following algorithm(s). As a first example algorithm to estimate the SoC (e.g., or processor) die thermal gradient: SOC_thermal_gradient=max (all SoC thermal sensors) −min (all SoC thermal sensors). In one embodiment where a SoC die is larger (e.g., in surface area) than a memory (e.g., DRAM) die, a modified SoC thermal gradient may be calculated with the SoC thermal sensor outside (e.g., not overlapping) the memory die coupling removed: SOC_thermal_gradient_related2Memory=max (all SoC thermal sensor excluding SoC sensor(s) outside of memory coupling)−min (all SoC thermal sensor(s) excluding the SOC sensor(s) outside of memory coupling). A memory die (e.g., die 2 in FIGS. 6-8) thermal gradient may be estimated according to MEMORY_die1_thermal_gradient=function (SOC_thermal_gradient, SOC_power, MEMORY_die1 power, thermal_scaling_factor 1). The function may be a linear or a non-linear function.

An additional (e.g., spaced apart with a die between it and a SoC die) memory die (e.g., die 1 in FIGS. 6-8) thermal gradient may be estimated according to MEMORY_die2_thermal_gradient=function (SOC_thermal_gradient, SOC_power, MEMORY_die1 power, thermal_scaling_factor 1, MEMORY_die2 power, thermal_scaling_factor_2)

In certain embodiments, a hardware control circuit may loop around to sample inputs (e.g., sensors and/or power) and determine conditions for refresh (e.g., self-refresh) and refresh rate control. The below is an example of a two die POP control of self-refresh and refresh rate):
    If(MEMORY_die1_thermal_gradient>=MEMORY_
      die1_SR_threshold) {Block SR entry and block idle
      (e.g., SOix) or deeper sleep (e.g., Sx) entry}
    New_refresh_rate=mid
    If(MEMORY_die1_thermal_gradient<=MEMORY_
      die1_threshold_X)
    New_refresh_rate=low
    Else if(MEMORY_die1_thermal_gradient>MEMORY_
      die1_threshold_Y)
    New_refresh_rate=high
    If(new_refresh_rate!=current_refresh_rate){
    Issue Dunit command to change DRAM_die1 refresh rate
    Dunit/Phy HW execute new refresh rate
    Current_refresh_rate=new_refresh_rate
    }

Similar control may be implemented for DRAM_die1_and DRAM_die2 in the three die POP case.

In certain embodiments, there are multiple ways to implement the estimation of thermal gradients and/or memory refresh or self-refresh (SR) control. Certain embodiments herein may utilize multiple thermal sensors placed on SoC die and/or memory die to better track thermal gradient, e.g., to have a tight control of refresh rate or SR at increased POP cost. In certain embodiments, there are multiple ways to manipulate thermal gradients by throttling a SoC's performance to reduce thermal gradient(s), e.g., if a SOC and/or memory performance reduction is acceptable or preferred over a refresh rate change. A silicon product may choose to implement one or multiple aspects of this disclosure. Certain embodiments herein ensure that memory (e.g., DRAM) is properly refreshed (e.g., either auto or SR) per its thermal conditions, for example, in a dynamic fashion. Certain embodiments herein allow a die to be spaced closer to another die in a POP, e.g., to achieve a smaller (thinner) Z axis height without compromising memory data retention.

FIG. 11 illustrates a flow diagram according to embodiments of the disclosure. Flow 1100 includes providing a processor die and a dynamic memory die mounted to and overlapping the processor die, wherein a first thermal sensor of the processor die is disposed adjacent to a first hot spot from a first type of workload and a second thermal sensor of the processor die is disposed adjacent to a second hot spot from a second type of workload 1102; and causing, with a hardware control circuit of the processor die, a refresh of a capacitor of the dynamic memory die when either of an output of the first thermal sensor exceeds a first threshold value and an output of the second thermal sensor exceeds a second threshold value 1104.

In one embodiment, an apparatus includes a processor die, a dynamic memory die mounted to and overlapping the processor die, a first thermal sensor of the processor die disposed adjacent to a first hot spot from a first type of workload and a second thermal sensor of the processor die disposed adjacent to a second hot spot from a second type of workload, and a hardware control circuit of the processor die to cause a refresh of a capacitor of the dynamic memory die when either of an output of the first thermal sensor exceeds a first threshold value and an output of the second thermal sensor exceeds a second threshold value. The apparatus may further include a second, dynamic memory die mounted to and overlapping one of the processor die and the dynamic memory die, wherein the hardware control circuit is to cause a refresh of a capacitor of the second, dynamic memory die when either of the output of the first thermal sensor exceeds the first threshold value and the output of the second thermal sensor exceed the second threshold value. The processor die may extend beyond the dynamic memory die, and the first thermal sensor of the processor die and the second thermal sensor of the processor die may be disposed adjacent to the dynamic memory die. The hardware control circuit of the processor die may not refresh the capacitor when either of the output of the first thermal sensor exceeds a third threshold value, greater than the first threshold value, and the output of the second thermal sensor exceeds a fourth threshold value, greater than the second threshold value. The hardware control circuit may cause the refresh when a difference between a higher of the outputs of the first thermal sensor and the second thermal sensor and the other of the outputs exceeds a threshold value. The hardware control circuit may further cause a refresh based on a power consumption of the dynamic memory die. Additionally or alternatively, the hardware control circuit may further cause a refresh based on a power consumption of the processor die.

In another embodiment, a method includes providing a processor die and a dynamic memory die mounted to and overlapping the processor die, wherein a first thermal sensor of the processor die is disposed adjacent to a first hot spot from a first type of workload and a second thermal sensor of the processor die is disposed adjacent to a second hot spot from a second type of workload, and causing, with a hardware control circuit of the processor die, a refresh of a capacitor of the dynamic memory die when either of an output of the first thermal sensor exceeds a first threshold value and an output of the second thermal sensor exceeds a second threshold value. The method may include providing a second, dynamic memory die mounted to and overlapping one of the processor die and the dynamic memory die, and causing, with the hardware control circuit, a refresh of a capacitor of the second, dynamic memory die when either of the output of the first thermal sensor exceeds the first threshold value and the output of the second thermal sensor exceed the second threshold value. The processor die may extend beyond the dynamic memory die, and the first thermal sensor of the processor die and the second thermal sensor of the processor die may be disposed adjacent to the dynamic memory die. The method may include not refreshing, with the hardware control circuit, the capacitor when either of the output of the first thermal sensor exceeds a third threshold value, greater than the first threshold value, and the output of the second thermal sensor exceeds a fourth threshold value, greater than the second threshold value. The hardware control circuit may not to cause the refresh when a difference between a higher of the outputs of the first thermal sensor and the second thermal sensor and the other of the outputs exceeds a threshold value. The hardware control circuit may further cause a refresh based on a power consumption of the dynamic memory die. Additionally or alternatively, the hardware control circuit may further cause a refresh based on a power consumption of the processor die.

In yet another embodiment, an apparatus includes a system on a chip die, a dynamic memory die mounted to and overlapping the system on a chip die, a first thermal sensor of the system on a chip die disposed adjacent to a first hot spot from a first type of workload and a second thermal sensor of the system on a chip die disposed adjacent to a second hot spot from a second type of workload, and a hardware control circuit of the system on a chip die to cause a refresh of a capacitor of the dynamic memory die when either of an output of the first thermal sensor exceeds a first threshold value and an output of the second thermal sensor exceeds a second threshold value. The apparatus may further include a second, dynamic memory die mounted to and overlapping one of the system on a chip die and the dynamic memory die, wherein the hardware control circuit is to cause a refresh of a capacitor of the second, dynamic memory die when either of the output of the first thermal sensor exceeds the first threshold value and the output of the second thermal sensor exceed the second threshold value. The system on a chip die may extend beyond the dynamic memory die, and the first thermal sensor of the system on a chip die and the second thermal sensor of the system on a chip die may be disposed adjacent to the dynamic memory die. The hardware control circuit of the system on a chip die may not refresh the capacitor when either of the output of the first thermal sensor exceeds a third threshold value, greater than the first threshold value, and the output of the second thermal sensor exceeds a fourth threshold value, greater than the second threshold value. The hardware control circuit may cause the refresh when a difference between a higher of the outputs of the first thermal sensor and the second thermal sensor and the other of the outputs exceeds a threshold value. The hardware control circuit may further cause a refresh based on a power consumption of the dynamic memory die. Additionally or alternatively, the hardware control circuit may further cause a refresh based on a power consumption of the system on a chip die.

In another embodiment, an apparatus includes a processor or SoC die, a dynamic memory die mounted to and overlapping the processor or SoC die, a first thermal sensor of the processor or SoC die disposed adjacent to a first hot spot from a first type of workload and a second thermal sensor of the processor or Soc die disposed adjacent to a second hot spot from a second type of workload, and means of the processor die to cause a refresh of a capacitor of the dynamic memory die when either of an output of the first thermal sensor exceeds a first threshold value and an output of the second thermal sensor exceeds a second threshold value.

In yet another embodiment, an apparatus comprises a data storage device that stores code that when executed by a hardware processor causes the hardware processor to perform any method disclosed herein. An apparatus may be as described in the detailed description. A method may be as described in the detailed description.

In another embodiment, a non-transitory machine readable medium that stores code that when executed by a machine causes the machine to perform a method comprising any method disclosed herein.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, April 2016; and see Intel® Architecture Instruction Set Extensions Programming Reference, February 2016).

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures
In-Order and Out-of-Order Core Block Diagram

FIG. 12A is a block diagram illustrating both an exemplary in-order pipeline and an exemplary register renaming, out-of-order issue/execution pipeline according to embodiments of the disclosure. FIG. 12B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 12A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 12A, a processor pipeline 1200 includes a fetch stage 1202, a length decode stage 1204, a decode stage 1206, an allocation stage 1208, a renaming stage 1210, a scheduling (also known as a dispatch or issue) stage 1212, a register read/memory read stage 1214, an execute stage 1216, a write back/memory write stage 1218, an exception handling stage 1222, and a commit stage 1224.

FIG. 12B shows processor core 1290 including a front end unit 1230 coupled to an execution engine unit 1250, and both are coupled to a memory unit 1270. The core 1290 may be a reduced instruction set computing (RISC) core, a complex instruction set computing (CISC) core, a very long instruction word (VLIW) core, or a hybrid or alternative core type. As yet another option, the core 1290 may be a special-purpose core, such as, for example, a network or communication core, compression engine, coprocessor core, general purpose computing graphics processing unit (GPGPU) core, graphics core, or the like.

The front end unit 1230 includes a branch prediction unit 1232 coupled to an instruction cache unit 1234, which is coupled to an instruction translation lookaside buffer (TLB) 1236, which is coupled to an instruction fetch unit 1238, which is coupled to a decode unit 1240. The decode unit 1240 (or decoder or decoder unit) may decode instructions (e.g., macro-instructions), and generate as an output one or more micro-operations, micro-code entry points, micro-instructions, other instructions, or other control signals, which are decoded from, or which otherwise reflect, or are derived from, the original instructions. The decode unit 1240 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1290 includes a microcode ROM or other medium that stores microcode for certain macroinstructions (e.g., in decode unit 1240 or otherwise within the front end unit 1230). The decode unit 1240 is coupled to a rename/allocator unit 1252 in the execution engine unit 1250.

The execution engine unit 1250 includes the rename/allocator unit 1252 coupled to a retirement unit 1254 and a set of one or more scheduler unit(s) 1256. The scheduler unit(s) 1256 represents any number of different schedulers, including reservations stations, central instruction window, etc. The scheduler unit(s) 1256 is coupled to the physical register file(s) unit(s) 1258. Each of the physical register file(s) units 1258 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1258 comprises a vector registers unit, a write mask registers unit, and a scalar registers unit. These register units may provide architectural vector registers, vector mask registers, and general purpose registers. The physical register file(s) unit(s) 1258 is overlapped by the retirement unit 1254 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1254 and the physical register file(s) unit(s) 1258 are coupled to the execution cluster(s) 1260. The execution cluster(s) 1260 includes a set of one or more execution units 1262 and a set of one or more memory access units 1264. The execution units 1262 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1256, physical register file(s) unit(s) 1258, and execution cluster(s) 1260 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1264). It should also be understood that where separate pipelines are used, one or more of these pipelines may be out-of-order issue/execution and the rest in-order.

The set of memory access units 1264 is coupled to the memory unit 1270, which includes a data TLB unit 1272 coupled to a data cache unit 1274 coupled to a level 2 (L2) cache unit 1276. In one exemplary embodiment, the memory access units 1264 may include a load unit, a store address unit, and a store data unit, each of which is coupled to the data TLB unit 1272 in the memory unit 1270. The instruction cache unit 1234 is further coupled to a level 2 (L2) cache unit 1276 in the memory unit 1270. The L2 cache unit 1276 is coupled to one or more other levels of cache and eventually to a main memory.

By way of example, the exemplary register renaming, out-of-order issue/execution core architecture may implement the pipeline 1200 as follows: 1) the instruction fetch 1238 performs the fetch and length decoding stages 1202 and 1204; 2) the decode unit 1240 performs the decode stage 1206; 3) the rename/allocator unit 1252 performs the allocation stage 1208 and renaming stage 1210; 4) the scheduler unit(s) 1256 performs the schedule stage 1212; 5) the physical register file(s) unit(s) 1258 and the memory unit 1270 perform the register read/memory read stage 1214; the execution cluster 1260 perform the execute stage 1216; 6) the memory unit 1270 and the physical register file(s) unit(s) 1258 perform the write back/memory write stage 1218; 7) various units may be involved in the exception handling stage 1222; and 8) the retirement unit 1254 and the physical register file(s) unit(s) 1258 perform the commit stage 1224.

The core 1290 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1290 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1234/1274 and a shared L2 cache unit 1276, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 13B:
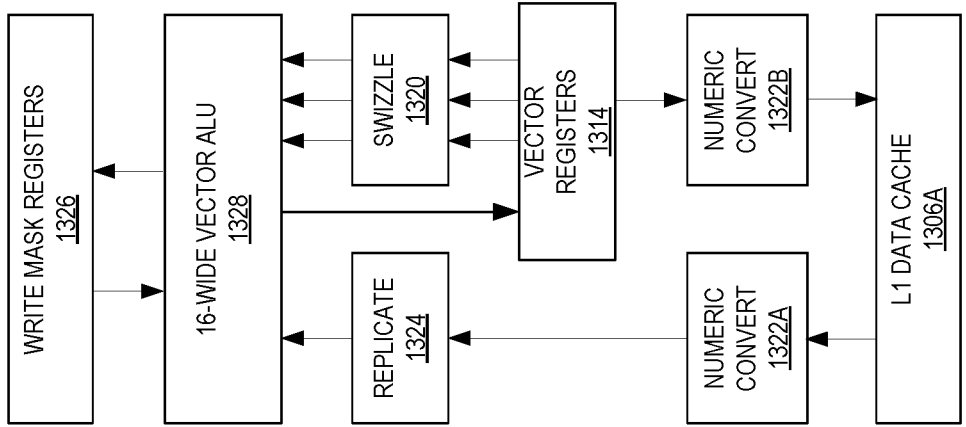
FIG. 13B is an expanded view of part of the processor core in FIG. 13A according to embodiments of the disclosure.
Figure 13A:
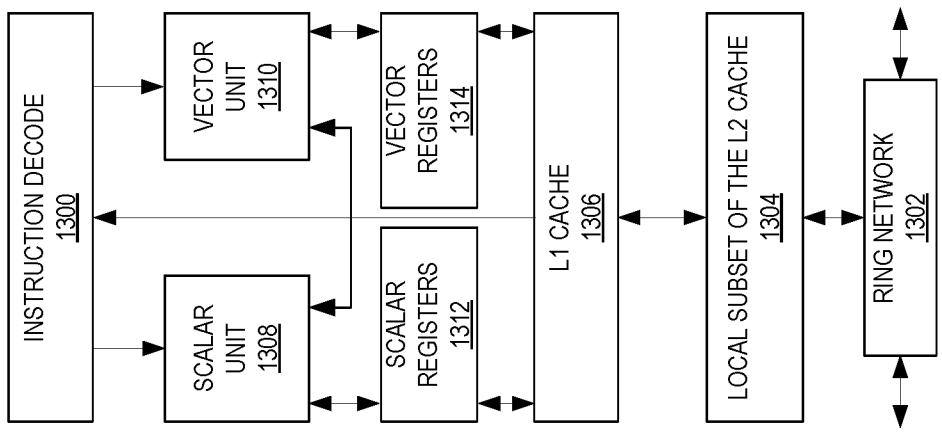
FIG. 13A is a block diagram of a single processor core, along with its connection to the on-die interconnect network and with its local subset of the Level 2 (L2) cache, according to embodiments of the disclosure.

FIGS. 13A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 13A is a block diagram of a single processor core, along with its connection to the on-die interconnect network 1302 and with its local subset of the Level 2 (L2) cache 1304, according to embodiments of the disclosure. In one embodiment, an instruction decode unit 1300 supports the x86 instruction set with a packed data instruction set extension. An L1 cache 1306 allows low-latency accesses to cache memory into the scalar and vector units. While in one embodiment (to simplify the design), a scalar unit 1308 and a vector unit 1310 use separate register sets (respectively, scalar registers 1312 and vector registers 1314) and data transferred between them is written to memory and then read back in from a level 1 (L1) cache 1306, alternative embodiments of the disclosure may use a different approach (e.g., use a single register set or include a communication path that allow data to be transferred between the two register files without being written and read back).

The local subset of the L2 cache 1304 is part of a global L2 cache that is divided into separate local subsets, one per processor core. Each processor core has a direct access path to its own local subset of the L2 cache 1304. Data read by a processor core is stored in its L2 cache subset 1304 and can be accessed quickly, in parallel with other processor cores accessing their own local L2 cache subsets. Data written by a processor core is stored in its own L2 cache subset 1304 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 13B is an expanded view of part of the processor core in FIG. 13A according to embodiments of the disclosure. FIG. 13B includes an L1 data cache 1306A part of the L1 cache 1304, as well as more detail regarding the vector unit 1310 and the vector registers 1314. Specifically, the vector unit 1310 is a 16-wide vector processing unit (VPU) (see the 16-wide ALU 1328), which executes one or more of integer, single-precision float, and double-precision float instructions. The VPU supports swizzling the register inputs with swizzle unit 1320, numeric conversion with numeric convert units 1322A-B, and replication with replication unit 1324 on the memory input. Write mask registers 1326 allow predicating resulting vector writes.

Figure 14:
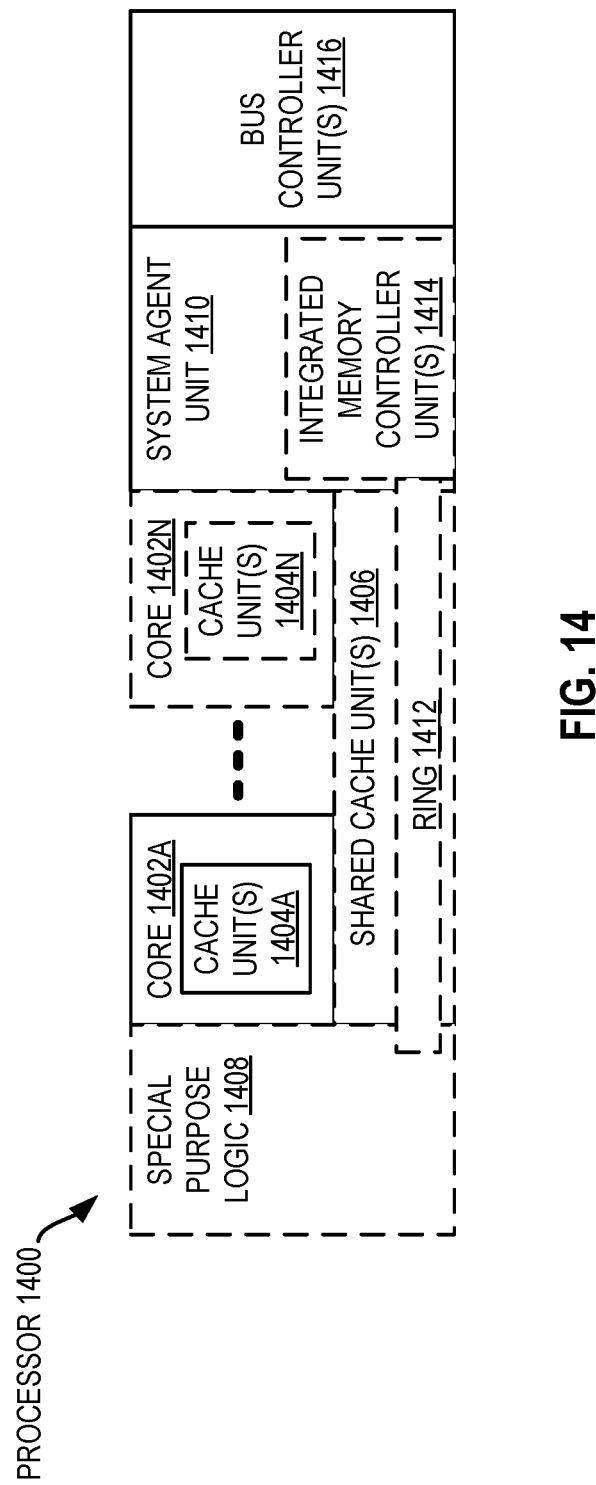
FIG. 14 is a block diagram of a processor that may have more than one core, may have an integrated memory controller, and may have integrated graphics according to embodiments of the disclosure.

FIG. 14 is a block diagram of a processor 1400 that may have more than one core, may have an integrated memory controller, and may have integrated graphics according to embodiments of the disclosure. The solid lined boxes in FIG. 14 illustrate a processor 1400 with a single core 1402A, a system agent 1410, a set of one or more bus controller units 1416, while the optional addition of the dashed lined boxes illustrates an alternative processor 1400 with multiple cores 1402A-N, a set of one or more integrated memory controller unit(s) 1414 in the system agent unit 1410, and special purpose logic 1408.

Thus, different implementations of the processor 1400 may include: 1) a CPU with the special purpose logic 1408 being integrated graphics and/or scientific (throughput) logic (which may include one or more cores), and the cores 1402A-N being one or more general purpose cores (e.g., general purpose in-order cores, general purpose out-of-order cores, a combination of the two); 2) a coprocessor with the cores 1402A-N being a large number of special purpose cores intended primarily for graphics and/or scientific (throughput); and 3) a coprocessor with the cores 1402A-N being a large number of general purpose in-order cores. Thus, the processor 1400 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1400 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1406, and external memory (not shown) coupled to the set of integrated memory controller units 1414. The set of shared cache units 1406 may include one or more mid-level caches, such as level 2 (L2), level 3 (L3), level 4 (L4), or other levels of cache, a last level cache (LLC), and/or combinations thereof. While in one embodiment a ring based interconnect unit 1412 interconnects the integrated graphics logic 1408, the set of shared cache units 1406, and the system agent unit 1410/integrated memory controller unit(s) 1414, alternative embodiments may use any number of well-known techniques for interconnecting such units. In one embodiment, coherency is maintained between one or more cache units 1406 and cores 1402-A-N.

In some embodiments, one or more of the cores 1402A-N are capable of multithreading. The system agent 1410 includes those components coordinating and operating cores 1402A-N. The system agent unit 1410 may include for example a power control unit (PCU) and a display unit. The PCU may be or include logic and components needed for regulating the power state of the cores 1402A-N and the integrated graphics logic 1408. The display unit is for driving one or more externally connected displays.

The cores 1402A-N may be homogenous or heterogeneous in terms of architecture instruction set; that is, two or more of the cores 1402A-N may be capable of execution the same instruction set, while others may be capable of executing only a subset of that instruction set or a different instruction set.

Exemplary Computer Architectures

FIGS. 15-18 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 15:
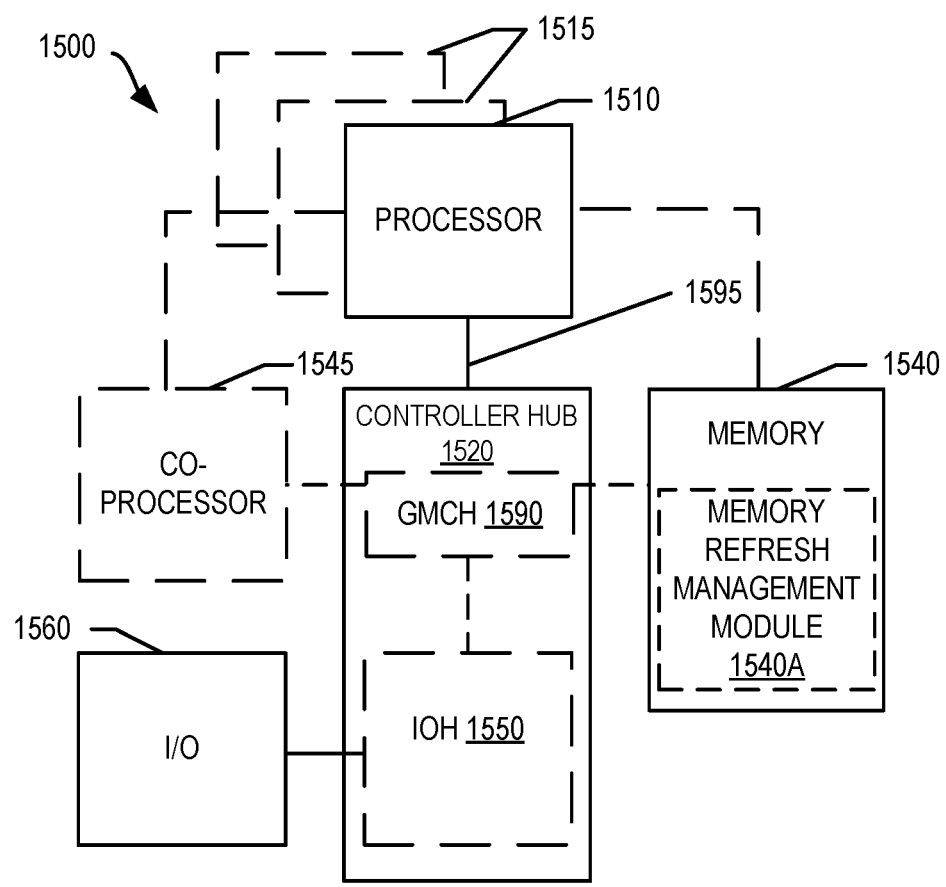
FIG. 15 is a block diagram of a system in accordance with one embodiment of the present disclosure.

Referring now to FIG. 15, shown is a block diagram of a system 1500 in accordance with one embodiment of the present disclosure. The system 1500 may include one or more processors 1510, 1515, which are coupled to a controller hub 1520. In one embodiment the controller hub 1520 includes a graphics memory controller hub (GMCH) 1590 and an Input/Output Hub (IOH) 1550 (which may be on separate chips); the GMCH 1590 includes memory and graphics controllers to which are coupled memory 1540 and a coprocessor 1545; the IOH 1550 is couples input/output (I/O) devices 1560 to the GMCH 1590. Alternatively, one or both of the memory and graphics controllers are integrated within the processor (as described herein), the memory 1540 and the coprocessor 1545 are coupled directly to the processor 1510, and the controller hub 1520 in a single chip with the IOH 1550. Memory 1540 may include a memory refresh management module 1540A, for example, to store code that when executed causes a processor to perform any method of this disclosure.

The optional nature of additional processors 1515 is denoted in FIG. 15 with broken lines. Each processor 1510, 1515 may include one or more of the processing cores described herein and may be some version of the processor 1400.

The memory 1540 may be, for example, dynamic random access memory (DRAM), phase change memory (PCM), or a combination of the two. For at least one embodiment, the controller hub 1520 communicates with the processor(s) 1510, 1515 via a multi-drop bus, such as a frontside bus (FSB), point-to-point interface such as QuickPath Interconnect (QPI), or similar connection 1595.

In one embodiment, the coprocessor 1545 is a special-purpose processor, such as, for example, a high-throughput MIC processor, a network or communication processor, compression engine, graphics processor, GPGPU, embedded processor, or the like. In one embodiment, controller hub 1520 may include an integrated graphics accelerator.

There can be a variety of differences between the physical resources 1510, 1515 in terms of a spectrum of metrics of merit including architectural, microarchitectural, thermal, power consumption characteristics, and the like.

In one embodiment, the processor 1510 executes instructions that control data processing operations of a general type. Embedded within the instructions may be coprocessor instructions. The processor 1510 recognizes these coprocessor instructions as being of a type that should be executed by the attached coprocessor 1545. Accordingly, the processor 1510 issues these coprocessor instructions (or control signals representing coprocessor instructions) on a coprocessor bus or other interconnect, to coprocessor 1545. Coprocessor(s) 1545 accept and execute the received coprocessor instructions.

Figure 16:
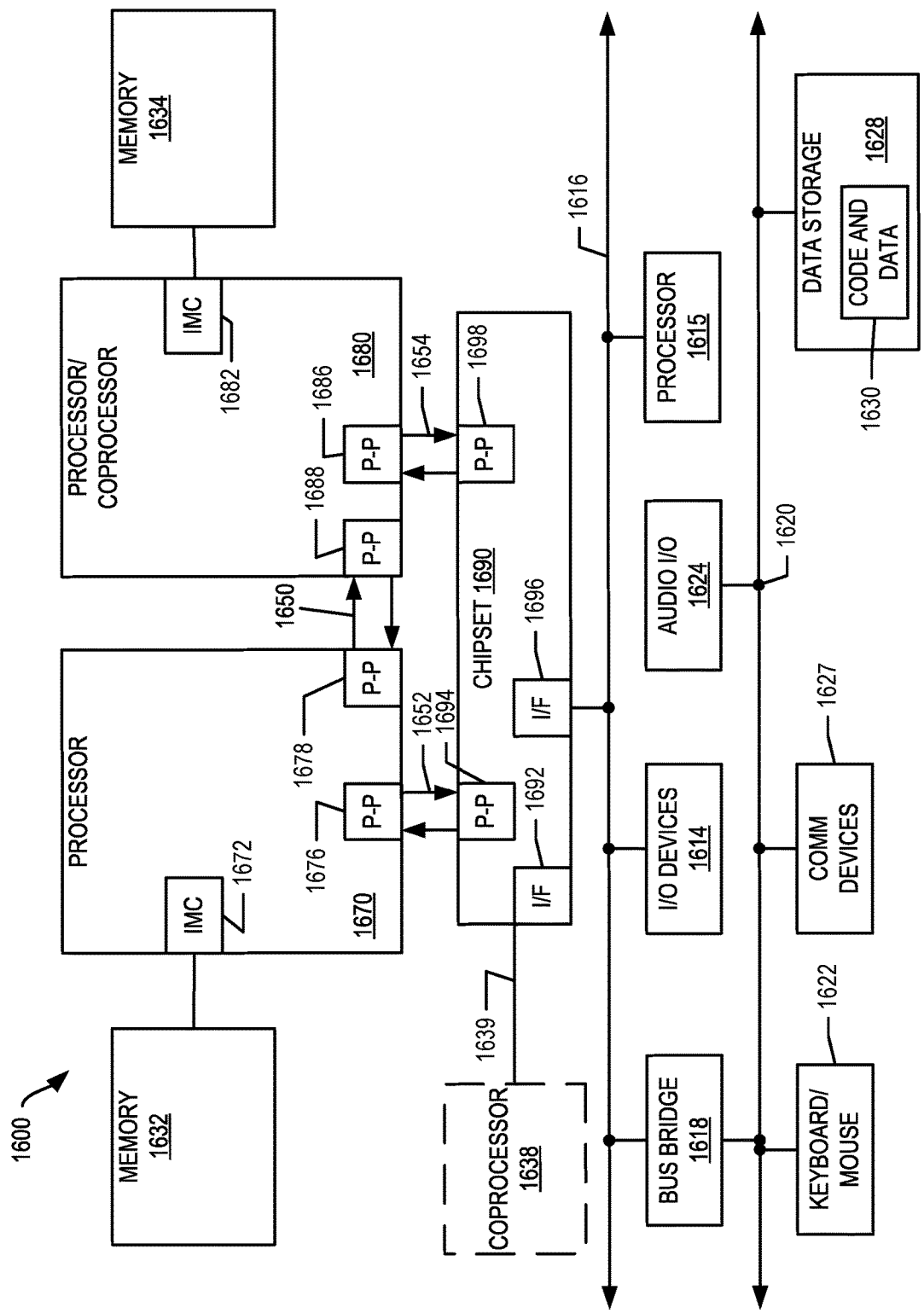
FIG. 16 is a block diagram of a more specific exemplary system in accordance with an embodiment of the present disclosure.

Referring now to FIG. 16, shown is a block diagram of a first more specific exemplary system 1600 in accordance with an embodiment of the present disclosure. As shown in FIG. 16, multiprocessor system 1600 is a point-to-point interconnect system, and includes a first processor 1670 and a second processor 1680 coupled via a point-to-point interconnect 1650. Each of processors 1670 and 1680 may be some version of the processor 1400. In one embodiment of the disclosure, processors 1670 and 1680 are respectively processors 1510 and 1515, while coprocessor 1638 is coprocessor 1545. In another embodiment, processors 1670 and 1680 are respectively processor 1510 coprocessor 1545.

Processors 1670 and 1680 are shown including integrated memory controller (IMC) units 1672 and 1682, respectively. Processor 1670 also includes as part of its bus controller units point-to-point (P-P) interfaces 1676 and 1678; similarly, second processor 1680 includes P-P interfaces 1686 and 1688. Processors 1670, 1680 may exchange information via a point-to-point (P-P) interface 1650 using P-P interface circuits 1678, 1688. As shown in FIG. 16, IMCs 1672 and 1682 couple the processors to respective memories, namely a memory 1632 and a memory 1634, which may be portions of main memory locally attached to the respective processors.

Processors 1670, 1680 may each exchange information with a chipset 1690 via individual P-P interfaces 1652, 1654 using point to point interface circuits 1676, 1694, 1686, 1698. Chipset 1690 may optionally exchange information with the coprocessor 1638 via a high-performance interface 1639. In one embodiment, the coprocessor 1638 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1690 may be coupled to a first bus 1616 via an interface 1696. In one embodiment, first bus 1616 may be a Peripheral Component Interconnect (PCI) bus, or a bus such as a PCI Express bus or another third generation I/O interconnect bus, although the scope of the present disclosure is not so limited.

As shown in FIG. 16, various I/O devices 1614 may be coupled to first bus 1616, along with a bus bridge 1618 which couples first bus 1616 to a second bus 1620. In one embodiment, one or more additional processor(s) 1615, such as coprocessors, high-throughput MIC processors, GPGPU's, accelerators (such as, e.g., graphics accelerators or digital signal processing (DSP) units), field programmable gate arrays, or any other processor, are coupled to first bus 1616. In one embodiment, second bus 1620 may be a low pin count (LPC) bus. Various devices may be coupled to a second bus 1620 including, for example, a keyboard and/or mouse 1622, communication devices 1627 and a storage unit 1628 such as a disk drive or other mass storage device which may include instructions/code and data 1630, in one embodiment. Further, an audio I/O 1624 may be coupled to the second bus 1620. Note that other architectures are possible. For example, instead of the point-to-point architecture of FIG. 16, a system may implement a multi-drop bus or other such architecture.

Figure 17:
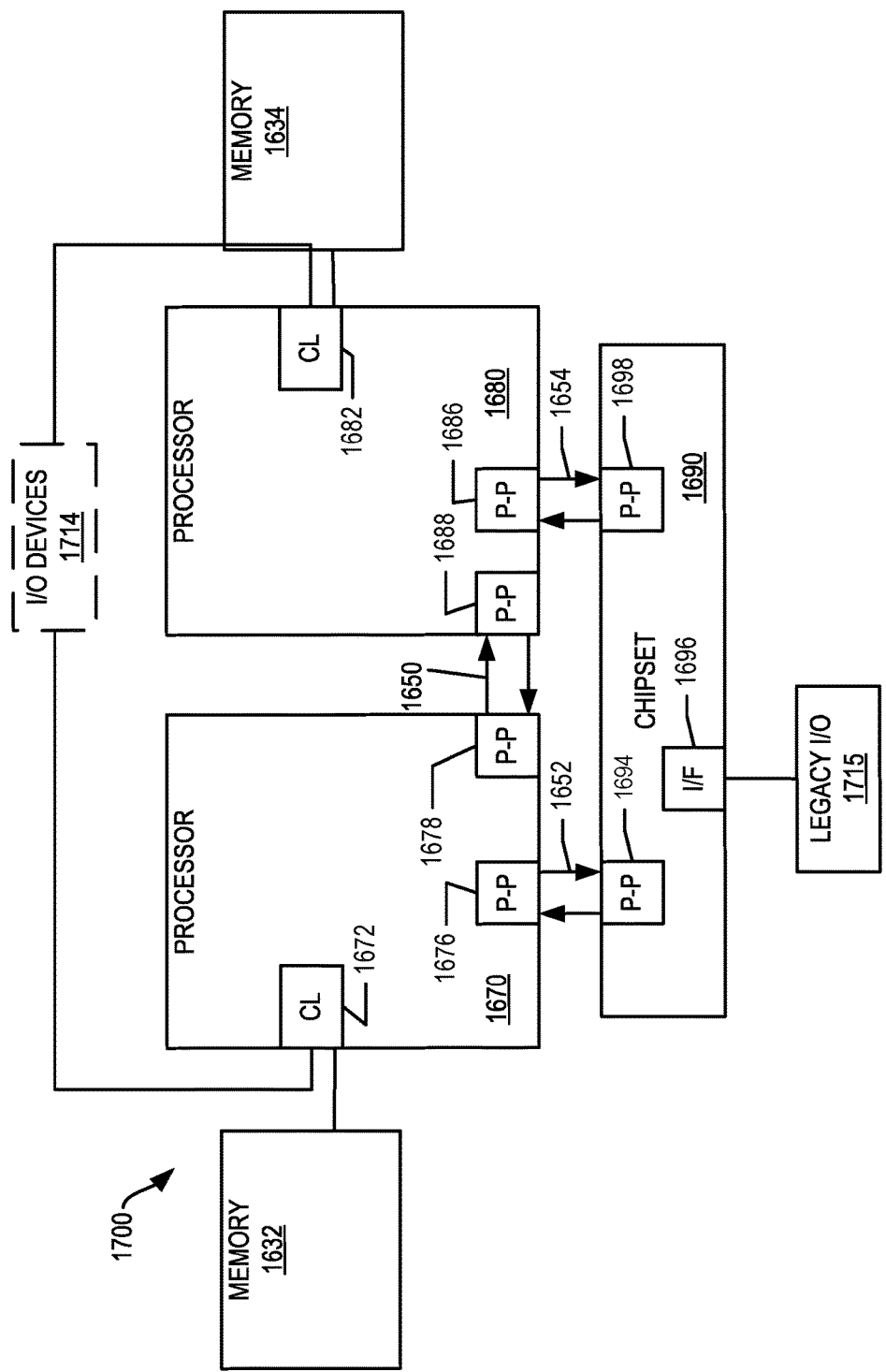
FIG. 17, shown is a block diagram of a second more specific exemplary system in accordance with an embodiment of the present disclosure.

Referring now to FIG. 17, shown is a block diagram of a second more specific exemplary system 1700 in accordance with an embodiment of the present disclosure Like elements in FIGS. 16 and 17 bear like reference numerals, and certain aspects of FIG. 16 have been omitted from FIG. 17 in order to avoid obscuring other aspects of FIG. 17.

FIG. 17 illustrates that the processors 1670, 1680 may include integrated memory and I/O control logic ("CL") 1672 and 1682, respectively. Thus, the CL 1672, 1682 include integrated memory controller units and include I/O control logic. FIG. 17 illustrates that not only are the memories 1632, 1634 coupled to the CL 1672, 1682, but also that I/O devices 1714 are also coupled to the control logic 1672, 1682. Legacy I/O devices 1715 are coupled to the chipset 1690.

Figure 18:
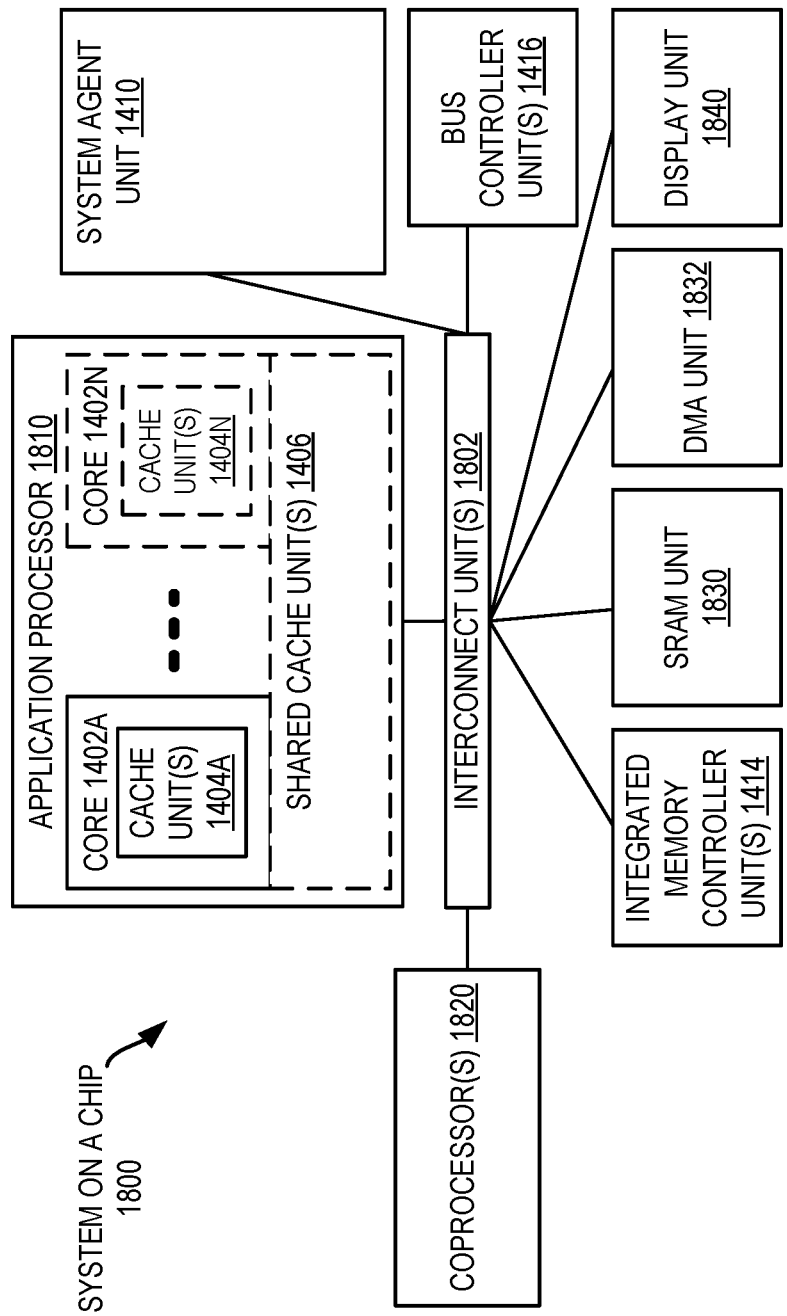
FIG. 18, shown is a block diagram of a system on a chip (SoC) in accordance with an embodiment of the present disclosure.

Referring now to FIG. 18, shown is a block diagram of a SoC 1800 in accordance with an embodiment of the present disclosure. Similar elements in FIG. 14 bear like reference numerals. Also, dashed lined boxes are optional features on more advanced SoCs. In FIG. 18, an interconnect unit(s) 1802 is coupled to: an application processor 1810 which includes a set of one or more cores 202A-N and shared cache unit(s) 1406; a system agent unit 1410; a bus controller unit(s) 1416; an integrated memory controller unit(s) 1414; a set or one or more coprocessors 1820 which may include integrated graphics logic, an image processor, an audio processor, and a video processor; an static random access memory (SRAM) unit 1830; a direct memory access (DMA) unit 1832; and a display unit 1840 for coupling to one or more external displays. In one embodiment, the coprocessor(s) 1820 include a special-purpose processor, such as, for example, a network or communication processor, compression engine, GPGPU, a high-throughput MIC processor, embedded processor, or the like.

Embodiments (e.g., of the mechanisms) disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1630 illustrated in FIG. 16, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 19:
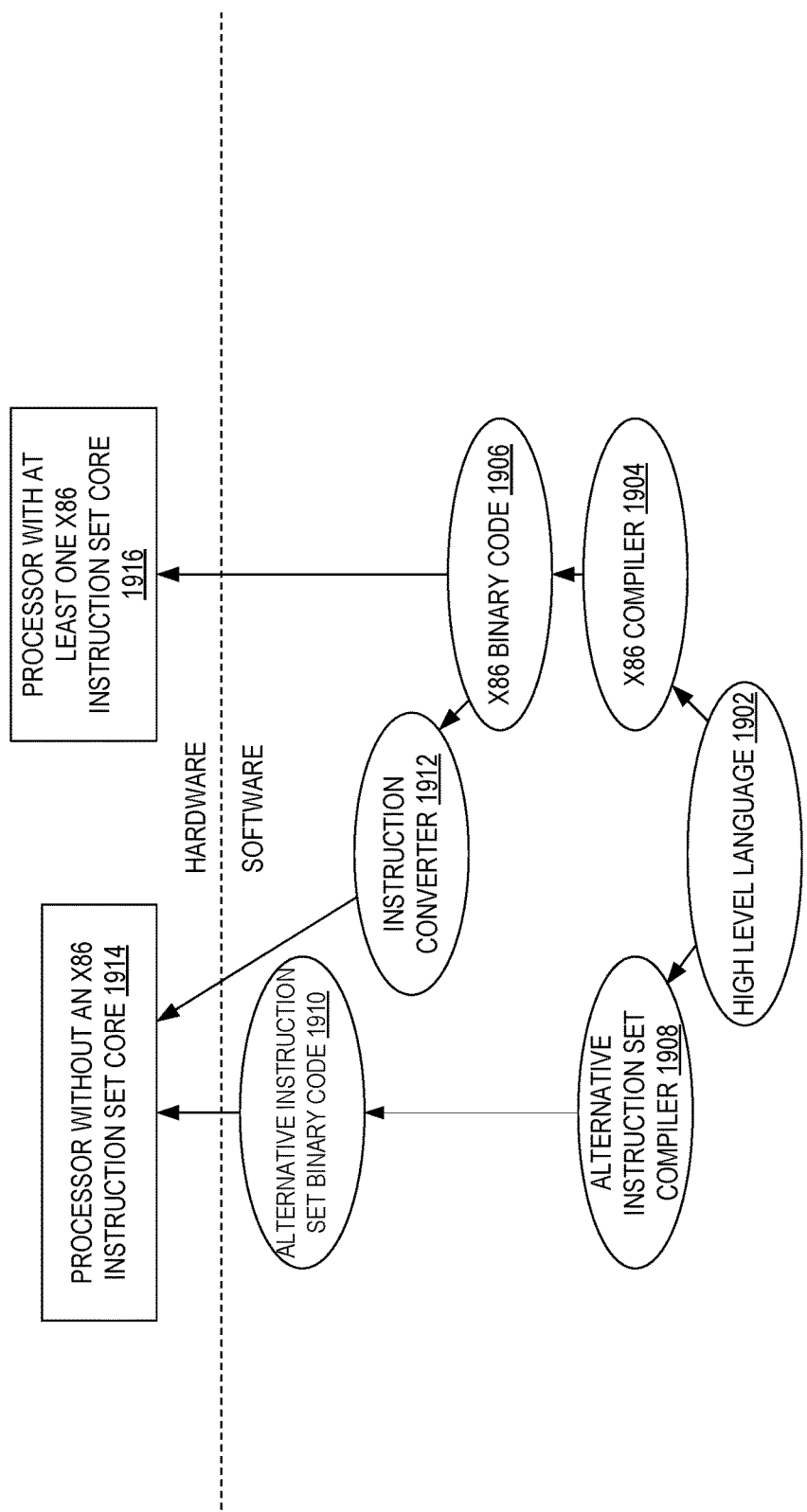
FIG. 19 is a block diagram contrasting the use of a software instruction converter to convert binary instructions in a source instruction set to binary instructions in a target instruction set according to embodiments of the disclosure.

FIG. 19 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 19 shows a program in a high level language 1902 may be compiled using an x86 compiler 1904 to generate x86 binary code 1906 that may be natively executed by a processor with at least one x86 instruction set core 1916. The processor with at least one x86 instruction set core 1916 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1904 represents a compiler that is operable to generate x86 binary code 1906 (e.g., object code) that can, with or without additional linkage processing, be executed on the processor with at least one x86 instruction set core 1916. Similarly, FIG. 19 shows the program in the high level language 1902 may be compiled using an alternative instruction set compiler 1908 to generate alternative instruction set binary code 1910 that may be natively executed by a processor without at least one x86 instruction set core 1914 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1912 is used to convert the x86 binary code 1906 into code that may be natively executed by the processor without an x86 instruction set core 1914. This converted code is not likely to be the same as the alternative instruction set binary code 1910 because an instruction converter capable of this is difficult to make; however, the converted code will accomplish the general operation and be made up of instructions from the alternative instruction set. Thus, the instruction converter 1912 represents software, firmware, hardware, or a combination thereof that, through emulation, simulation or any other process, allows a processor or other electronic device that does not have an x86 instruction set processor or core to execute the x86 binary code 1906.

What is claimed is:

1. An apparatus comprising:
   a processor die;
   a dynamic memory die mounted to and overlapping the processor die;
   a first thermal sensor of the processor die disposed adjacent to a first hot spot from a first type of workload and a second thermal sensor of the processor die disposed adjacent to a second hot spot from a second type of workload; and
   a hardware control circuit of the processor die to cause a refresh of a capacitor of the dynamic memory die when either of an output of the first thermal sensor exceeds a first threshold value and an output of the second thermal sensor exceeds a second threshold value.

2. The apparatus of claim 1, further comprising a second, dynamic memory die mounted to and overlapping one of the processor die and the dynamic memory die, wherein the hardware control circuit is to cause a refresh of a capacitor of the second, dynamic memory die when either of the output of the first thermal sensor exceeds the first threshold value and the output of the second thermal sensor exceed the second threshold value.

3. The apparatus of claim 1, wherein the processor die extends beyond the dynamic memory die, and the first thermal sensor of the processor die and the second thermal sensor of the processor die are disposed adjacent to the dynamic memory die.

4. The apparatus of claim 1, wherein the hardware control circuit of the processor die is to not refresh the capacitor when either of the output of the first thermal sensor exceeds a third threshold value, greater than the first threshold value, and the output of the second thermal sensor exceeds a fourth threshold value, greater than the second threshold value.

5. The apparatus of claim 1, wherein the hardware control circuit is to cause the refresh when a difference between a higher of the outputs of the first thermal sensor and the second thermal sensor and the other of the outputs exceeds a threshold value.

6. The apparatus of claim 1, wherein the hardware control circuit is to further cause a refresh based on a power consumption of the dynamic memory die.

7. The apparatus of claim 6, wherein the hardware control circuit is to further cause a refresh based on a power consumption of the processor die.

8. The apparatus of claim 1, wherein the hardware control circuit is to further cause a refresh based on a power consumption of the processor die.

9. A method comprising:
providing a processor die and a dynamic memory die mounted to and overlapping the processor die, wherein a first thermal sensor of the processor die is disposed adjacent to a first hot spot from a first type of workload and a second thermal sensor of the processor die is disposed adjacent to a second hot spot from a second type of workload; and
causing, with a hardware control circuit of the processor die, a refresh of a capacitor of the dynamic memory die when either of an output of the first thermal sensor exceeds a first threshold value and an output of the second thermal sensor exceeds a second threshold value.

10. The method of claim 9, further comprising:
providing a second, dynamic memory die mounted to and overlapping one of the processor die and the dynamic memory die; and
causing, with the hardware control circuit, a refresh of a capacitor of the second, dynamic memory die when either of the output of the first thermal sensor exceeds the first threshold value and the output of the second thermal sensor exceed the second threshold value.

11. The method of claim 9, wherein the processor die extends beyond the dynamic memory die, and the first thermal sensor of the processor die and the second thermal sensor of the processor die are disposed adjacent to the dynamic memory die.

12. The method of claim 9, further comprising not refreshing, with the hardware control circuit, the capacitor when either of the output of the first thermal sensor exceeds a third threshold value, greater than the first threshold value, and the output of the second thermal sensor exceeds a fourth threshold value, greater than the second threshold value.

13. The method of claim 9, wherein the hardware control circuit is to cause the refresh when a difference between a higher of the outputs of the first thermal sensor and the second thermal sensor and the other of the outputs exceeds a threshold value.

14. The method of claim 9, wherein the hardware control circuit is to further cause a refresh based on a power consumption of the dynamic memory die.

15. The method of claim 14, wherein the hardware control circuit is to further cause a refresh based on a power consumption of the processor die.

16. The method of claim 9, wherein the hardware control circuit is to further cause a refresh based on a power consumption of the processor die.

17. An apparatus comprising:
a system on a chip die;
a dynamic memory die mounted to and overlapping the system on a chip die;
a first thermal sensor of the system on a chip die disposed adjacent to a first hot spot from a first type of workload and a second thermal sensor of the system on a chip die disposed adjacent to a second hot spot from a second type of workload; and
a hardware control circuit of the system on a chip die to cause a refresh of a capacitor of the dynamic memory die when either of an output of the first thermal sensor exceeds a first threshold value and an output of the second thermal sensor exceeds a second threshold value.

18. The apparatus of claim 17, further comprising a second, dynamic memory die mounted to and overlapping one of the system on a chip die and the dynamic memory die, wherein the hardware control circuit is to cause a refresh of a capacitor of the second, dynamic memory die when either of the output of the first thermal sensor exceeds the first threshold value and the output of the second thermal sensor exceed the second threshold value.

19. The apparatus of claim 17, wherein the system on a chip die extends beyond the dynamic memory die, and the first thermal sensor of the system on a chip die and the second thermal sensor of the system on a chip die are disposed adjacent to the dynamic memory die.

20. The apparatus of claim 17, wherein the hardware control circuit of the system on a chip die is to not refresh the capacitor when either of the output of the first thermal sensor exceeds a third threshold value, greater than the first threshold value, and the output of the second thermal sensor exceeds a fourth threshold value, greater than the second threshold value.

21. The apparatus of claim 17, wherein the hardware control circuit is to cause the refresh when a difference between a higher of the outputs of the first thermal sensor and the second thermal sensor and the other of the outputs exceeds a threshold value.

22. The apparatus of claim 17, wherein the hardware control circuit is to further cause a refresh based on a power consumption of the dynamic memory die.

23. The apparatus of claim 22, wherein the hardware control circuit is to further cause a refresh based on a power consumption of the system on a chip die.

24. The apparatus of claim 17, wherein the hardware control circuit is to further cause a refresh based on a power consumption of the system on a chip die.

* * * * *